(12) United States Patent
Finney

(10) Patent No.: US 6,404,037 B1
(45) Date of Patent: Jun. 11, 2002

(54) INSULATED GATE BIPOLAR TRANSISTOR

(75) Inventor: Adrian Finney, Uppermill (GB)

(73) Assignee: Semiconductor Components Industries LLC, Phoenix, AZ (US)

(*) Notice: Subject to any disclaimer, the term of this patent is extended or adjusted under 35 U.S.C. 154(b) by 0 days.

(21) Appl. No.: 09/179,739

(22) Filed: Oct. 27, 1998

(30) Foreign Application Priority Data

Oct. 29, 1997 (EP) .............................. 97402571

(51) Int. Cl.[7] .............................................. H01L 21/331
(52) U.S. Cl. ......................... 257/583; 257/587; 257/590
(58) Field of Search ................................ 257/583, 585, 257/587, 591, 592, 590, 153

(56) References Cited

U.S. PATENT DOCUMENTS

| 5,124,772 A | * | 6/1992 | Hideshima et al. | |
| 5,227,315 A | * | 7/1993 | Frisina et al. | |
| 5,283,202 A | * | 2/1994 | Pike, Jr. et al. | |
| 5,510,634 A | | 4/1996 | Okabe et al. | 257/139 |
| 5,602,446 A | | 2/1997 | Kolber et al. | 315/241 |
| 6,054,369 A | * | 4/2000 | Neilson et al. | |

FOREIGN PATENT DOCUMENTS

| EP | 0380249 | 8/1990 |
| EP | 0694960 | 1/1996 |
| WO | 9116730 | 10/1991 |

OTHER PUBLICATIONS

"Optimized Local Lifetime Control For The Superior IGBTs", Konishi et al., Proceedings of the 8th International Symposium on Power Semiconductor Devices and IC's (ISPSD), Maui, Hawaii, May 20–23, 1996, p. 335–339.

"NPT–IGBT—Optimizing For Manufacturability", Burns et al., Proceedings of the 8th International Symposium on Power Semiconductor Devices and IC's (ISPSD), Maui, Hawaii, May 20–23, 1996, p. 331–334.

* cited by examiner

Primary Examiner—George Fourson

(57) ABSTRACT

An insulated gate bipolar transistor having a collector electrode 3, an emitter region 6 and a base region 4 formed between the collector electrode and the emitter region, further including a channel stop region 17 spaced from the emitter region and electrically connected to the collector electrode. The base region 4 includes a first region 4c between the emitter region and the channel stop region and a second region between the first region and the collector electrode, the first region having a higher minority-carrier-lifetime than the second region, whereby the first region provides a conductivity modulated conduction path between the emitter region and the channel stop region when the insulated gate bipolar transistor is reverse biased.

2 Claims, 1 Drawing Sheet

INSULATED GATE BIPOLAR TRANSISTOR

TECHNICAL FIELD

Figure 1:
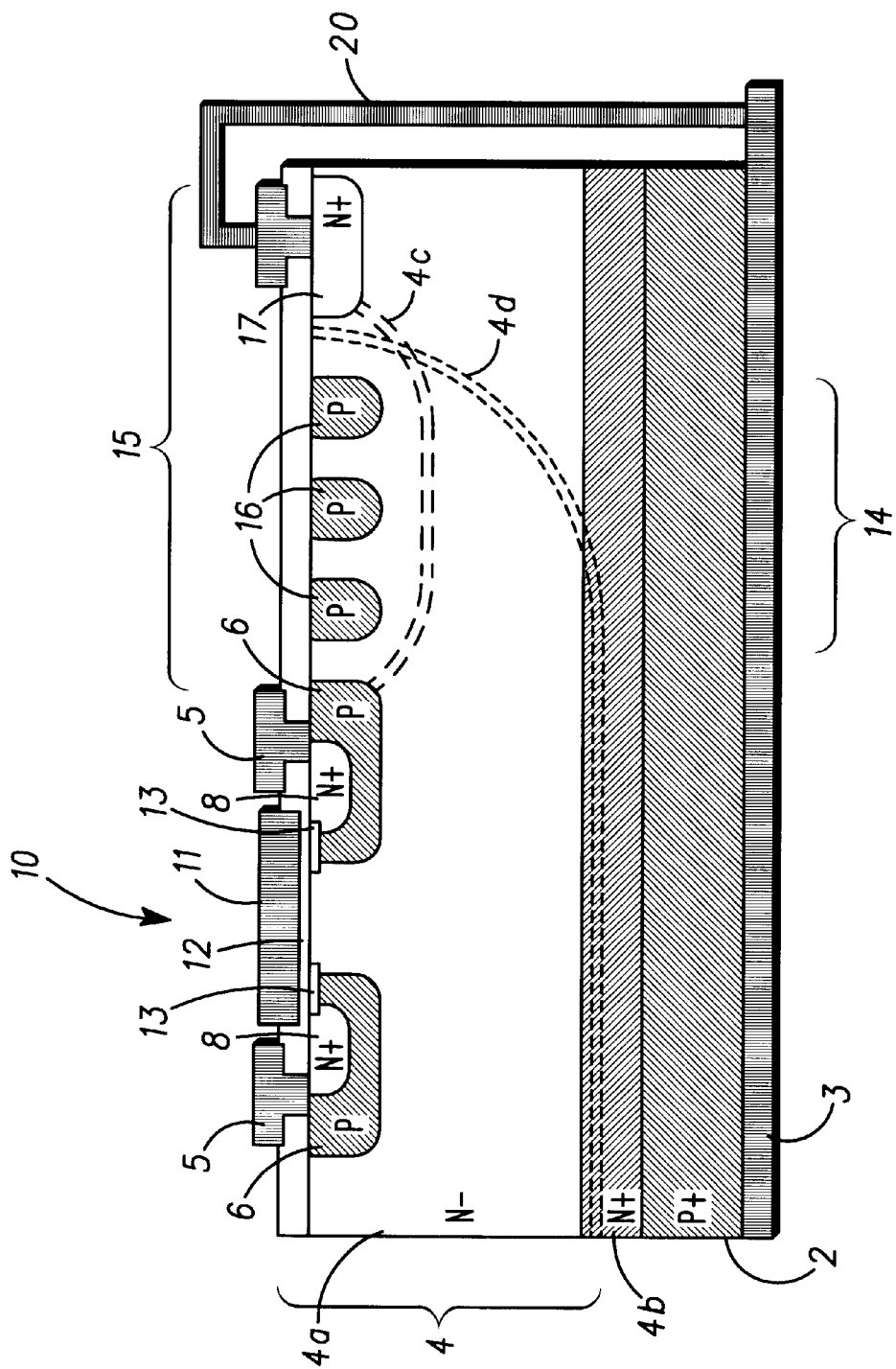

The present invention relates to an insulated gate bipolar transistor and to a method of forming the same. In particular, the present invention relates to an insulated gate bipolar transistor having improved reverse bias conducting properties and a method of forming the same.

BACKGROUND OF THE INVENTION

Insulated gate bipolar transistors (IGBT's) are well known in the art and have found particular application in the driving circuits of compact fluorescent lamps. In such applications, the much larger current density which can flow through the IGBT when switched on and forwardly biased, when compared with a power MOSFET, is of significant advantage.

However, it is also typically required of such transistors that they are able to conduct freely when reverse biased. Conventionally IGBT's have provided for reverse bias conduction simply by introducing a diode in parallel with the collector and emitter electrodes of the transistor but formed separately from the transistor itself. Clearly this increases the die size required by the combination of transistor and diode thus minimising the advantage of the IGBT over a conventional power MOSFET.

A solution to the problem of providing reverse bias conduction without having to provide a separately formed diode has been proposed which essentially comprises connecting the collector electrode to an end channel region of the IGBT. In addition, the end channel region must be widened so as to minimise the voltage, Vf, produced across the transistor when conducting in a reverse bias mode. However, although widening the end channel region in this way reduces Vf there is a limit to how much the Vf can be reduced in this way without affecting the operation of the transistor in its forward bias mode. This results in the significant disadvantages of having an undesirably large Vf in addition to an undesirably large end channel region.

The present invention seeks to provide an IGBT and a method of forming the same which at least mitigates the disadvantages of the prior art devices discussed above.

DETAILED DESCRIPTION OF THE DRAWINGS

In order that the present invention may be better understood an embodiment thereof will now be described by way of example only and with reference to the accompanying drawings in which:

The sole FIGURE is a diagrammatic cross-sectional view of a transistor according to the present invention.

DETAILED DESCRIPTION OF THE DRAWINGS

The sole FIGURE shows a construction according to the present invention. The majority of the structure is well known in the art as an Insulated Gate Bipolar Transistor (IGBT) structure. There is a bipolar transistor structure comprising three regions 2, 4, 6 of alternating conductivity type. In the sole FIGURE the alternating regions are shown as being in a pnp configuration. In this way a p-type emitter region 6 is formed in an n-type base region 4 which, in turn, is formed on a p-type collector region 2. A further region 8, having the same conductivity type as the base region (n-type), is formed within the p-type emitter portion 6. A collector electrode 3 is connected to the exposed underneath side of the collector region 2. An electrode which may conveniently be termed an emitter electrode 5 is connected both to the emitter region 6 and the further region 8. To complete the basic structure of the IGBT, a gate portion 10 is formed which includes a conductive gate electrode 11 and a thin insulating layer 12 and which extends substantially across a part of the emitter region 6 in such a way as to enable an inversion channel 13 to be formed across the emitter region 6 between the further region 8 and the base portion 4.

When in use, this basic IGBT structure operates as follows. In order to have the transistor switched on and forward biased, the emitter electrode 5 is grounded while the gate 11 and collector 3 electrodes are raised to a positive potential. Since both the p-type emitter region 6 and the n-type further region 8 are connected to the emitter electrode 5 they are at ground potential. The gate electrode 11 is positive with respect to the grounded p-type emitter region 6 underneath it and so it attracts electrons to the top of the p-type layer (which can not pass into the gate electrode 11 because of the thin insulating layer 12 disposed between the electrode 11 and the emitter region 6) eventually forming a very narrow n-type inversion channel 13 (hence an IGBT having this structure is termed an n channel IGBT) in the top of the p-type emitter region 6 just underneath the insulating layer 12. It is this inversion channel 13 which connects the n-type further region 8 across the p-type emitter portion 6 (which would otherwise present an impassable reverse-biased np junction) to the base region 4 allowing current flow.

It will be appreciated by a person skilled in the art that the p-type emitter region 6 should be mediumly doped underneath the gate electrode 11, the exact doping used depending on the desired switch-on characteristics of the IGBT (clearly the greater the doping, the more difficult it will be to form the inversion channel 13, and a greater voltage must therefore be applied to the gate electrode 11). However, immediately underneath the emitter electrode 5, the p-type emitter region 6 should be sufficiently highly doped to provide a good ohmic contact with the electrode 5. As is well known in the art, this can be achieved by forming just a thin layer of highly doped p-type material immediately underneath the electrode 5.

This mechanism is identical to a power MOSFET. Indeed, if there was no p-type collector region 2 so that the positive supply from the collector electrode 3 was connected to the n-type base region 4, the structure would be that of a vertical n channel power MOSFET.

However, because the IGBT structure has this extra p-type collector region 2 and because the collector region 2 has a positive potential relative to the emitter electrode 5 the pn junction between the collector region 2 and the base region 4 is forward biased. This does not cause the structure to behave simply as a vertical power MOSFET in series with a diode because holes are injected from the p-type collector region 2 and many of them pass through the n-type base region 4 and into the grounded p-type emitter region 6. In other words, the structure behaves as a vertical PNP transistor whose base current is supplied by the MOSFET operation of the gate portion 10 together with emitter region 6.

Conventionally in an n-channel IGBT, the P+ region 2 is called the collector region and the P region 6 is called the emitter region, and this conventional terminology will be applied throughout. This terminology is generally used because of marketing rather than physical reasons since an n-channel IGBT can be compared to an npn bipolar transistor in which the "gate" electrode 11 is compared to the base electrode of an npn transistor. The important point of the analogy being that the device is 'off' with the gate at a negative bias and 'on' with the gate at a positive bias.

However, as is well known to a person skilled in the art, an n-channel IGBT does not in fact contain an npn transistor but a pnp one. Therefore, the real physical emitter and collector regions are reversed so that during the forward biased on state the emitter of the internal pnp transistor is actually the bottom positive biased P+ region 2 (referred to throughout this description as the collector region 2—since this is 'emitting' carriers into the N– base region 4) and the collector is the negative biased top surface P region 6 (referred to throughout this description as the emitter region 6—since this is 'collecting' carriers).

Furthermore, the injection of minority carriers (holes) into the base region 4 from the collector region 2 (where they were clearly majority carriers) when the transistor is in the forward biased on state acts to significantly increase the conductivity of the quite wide base region 4 (so termed conductivity modulation). This is, of course, typical of the known basic IGBT structure and explains the significantly greater current density which can flow through a forward biased IGBT compared to a power MOSFET.

When the transistor is switched off (by removing the positive potential applied to the gate electrode 11), the inversion channel 13 is rapidly closed thus effectively switching off the base current to the bipolar transistor comprising collector region 2, base region 4 and emitter region 6. However, as with any bipolar transistor arrangement, while there are minority carriers remaining in the base region the collector current will continue to flow until there are no minority carriers left. This would lead to an unacceptably long switch off time if not addressed in some way. In order to solve this problem, the standard solution in the industry is to adjust (i.e. reduce) the minority-carrier-lifetime of the silicon used to form the bulk region 4a. This reduces the time for which minority carriers persist in the base region 4 after the inversion channel has been cut off. A typical method of reducing the minority-carrier-lifetime of the silicon is to use electron irradiation.

It will be appreciated by a person skilled in the art that there is a substantially direct correlation between the amount of reduction of the minority-carrier-lifetime of the base region of an IGBT, particularly proximate to the collector region of the IGBT, and the switching speed of the IGBT. The present invention is primarily concerned with IGBT's having a switching speed of less than one microsecond. It is known in the art that for a given switching speed there will be only a certain range of minority-carrier-lifetime profiles which are able to achieve the given switching speed or better, and it is within the capabilities of a person skilled in the art to calculate suitable profiles.

The IGBT shown in the sole FIGURE also includes a relatively large termination portion 15 which comprises a series of termination regions 16 of conductivity type opposite to the base region (i.e. in this case of p-type conductivity) extending downwardly from the upper surface of the die, together with a channel stop region 17. The channel stop region 17 is of the same conductivity type as the base region 4 but is much more highly doped. The effect of the termination regions 16 is to extend the depletion zone created in the lightly doped N– bulk region 4a of the base portion during forward bias of the transistor when in an off state right across the termination portion 15 as far as the channel stop region 17. The channel stop region 17 limits the extent of the depletion region since the depletion region cannot extend far within the highly doped N+ region.

Of course, it will be apparent to a person skilled in the art that the termination portion shown in the sole FIGURE represents only one possible configuration with many other suitable configurations being readily apparent. In general, however, all such termination portions suitable for use in an IGBT will share the properties of acting to extend the depletion layer a significant distance perpendicularly away from the active region between the emitter portion 6 and the collector region 2 (e.g. for a 600V IGBT the termination width 14 may be of the order of 180 micrometers, while the base region 4 may have a thickness of the order of 45 micrometers).

In addition to having this basic IGBT structure, the IGBT shown in the sole FIGURE has the n-type base region split into a lightly doped N– bulk region 4a (e.g. having a thickness of about 40–55 microns and doped so as to have a resistivity, $\rho$, of approximately 25 $\Omega$cm<$\rho$<35 $\Omega$cm) and a highly doped N+buffer layer 4b (e.g. having a thickness of about 5–10 microns and doped so as to have a resistivity, $\rho$, of approximately 0.02 $\Omega$cm<$\rho$<0.06 $\Omega$cm) immediately above the p-type collector region 2. Furthermore, the p-type collector region 2 is also highly doped (e.g. sufficiently doped to form an ohmic contact with the collector electrode) to form a P+ region such that the pn junction between the collector region 2 and the base region 4 is a P+N+ junction.

The highly doped N+ buffer layer 4b is frequently found in IGBT's to limit the extent of the depletion region so that it does not extend to the P+ collector region.

An important feature of the IGBT according to the present embodiment is that an electrical connection has been made between the channel stop region 17 and the collector electrode 3. In the sole FIGURE, this is shown as a down-bond 20 the formation of which would be readily apparent to a person skilled in the art. It is convenient to form the electrical connection between the N+ channel stop region 17 and the collector electrode 3, since the N+ channel stop region is a standard feature of a typical IGBT and it enables a good, ohmic connection to be made to the base region using a metal wire, etc. Nonetheless, it will be apparent to a person skilled in the art that the principle objective is to electrically connect the collector electrode to the base region 4 beyond the depletion region (indicated by dotted line 4d in the FIGURE). Therefore, in certain applications it may be more convenient to use some alternative connection point to the base region 4 beyond the depletion region, and the term channel stop region is intended to cover any such connection point.

As mentioned above, it is known to connect the collector electrode to a channel stop region in this way and it gives rise to the significant advantage that the IGBT will then be able to conduct when it is reverse biased. The way in which reverse conduction occurs in the known IGBT having a connection between the channel stop and the collector electrode is as follows. The pn junction from the emitter region 6 to the base region 4 is forwardly biased when the transistor is reverse biased. This enables current to flow across the lightly doped bulk region 4a of the base region 4 and into the N+ buffer layer 4b. Although the N-bulk region 4a has an inherently low conductivity, the portion of the bulk region 4a in the active portion between the emitter region 6 and the collector region 2 is conductivity modulated by the injection of minority carriers from the emitter region 6. The second section of the current path is along the inherently high conductivity N+ buffer layer 4b until it is directly beneath (in a vertical IGBT such as the one shown in the sole FIGURE) the channel stop region 17 which is electrically connected to the collector electrode 3, whereupon the current flows in a third section of the current path from the N+ buffer layer 4b to the N+ channel stop region 17, thus completing the conduction path from emitter electrode 5 to conductor electrode 3 as desired. The first two sections of the current path present little resistance to the flow of current, however the third section does present a significant resistance because it is largely through the inherently low conductivity N− bulk region 4a which, because it is too far from the emitter region 6, is not conductivity modulated (unlike the first section of the current path which is).

It is therefore across this section of the conduction path that the majority of the Vf potential across the transistor is generated when the transistor is conducting in a reverse biased mode. In order to reduce this Vf, it is possible to increase the surface area of the N+ channel stop region 17 (to increase the cross-sectional area of current flowing along the third current path section) by increasing its width but this necessarily increases the die size of the transistor. Furthermore, the resistance from the channel stop region 17 to the buffer layer 4b can only be reduced to a certain minimum amount before the pn junction from the collector region 2 to the buffer layer 4b is effectively shorted when operating in the forward bias on state which would prevent the proper functioning of the transistor in this forward biased on mode.

The IGBT of the present embodiment however has a different reverse bias conduction path to that described above. In the IGBT of the present invention a high minority-carrier-lifetime region 4c is provided in the bulk region 4a between the emitter region 6 and the channel stop region 17. The high minority-carrier-lifetime region 4c comprises lightly doped N− semiconductor material for which the minority-carrier-lifetime has not been reduced in the way that the majority of the rest of the lightly doped bulk region 4b of the base region 4 has been. In this way, there is formed in the base region 4, a first region 4c between the emitter region 6 and the channel stop region 17 and a second region between the first region 4c and the collector region 2 (and thus the collector electrode 3), the first region 4c having a higher minority-carrier-lifetime than the second region whereby the first region 4c provides a conductivity modulated conduction path between the emitter region 6 and the channel stop region 17 when the IGBT is reverse biased. Furthermore, the second region ensures that the IGBT is able to perform in a forward biased mode at high switching speeds.

That is to say, when operating in the reverse bias mode, this high minority-carrier-lifetime region 4c can be substantially completely conductivity modulated to provide a low resistance conduction path between the emitter region 6 (and thus the emitter electrode 5) and the channel stop region 17 (and thus the collector electrode 3) without providing a short-circuit around the pn junction formed between the collector region 2 and the buffer layer 4b since when the transistor is forwardly biased there is no forwardly biased pn junction in the vicinity of the channel stop region 17 to inject minority carriers into the high minority-carrier-lifetime region 4c.

The provision of a high minority-carrier-lifetime region 4c gives rise to significant advantages. For example, for a desired switching speed of less than 1 microsecond even down to about 200 nanoseconds, it is possible to produce an IGBT having a channel stop region whose total surface area occupies less than 15% of the total die area of the IGBT and whose reverse bias diode voltage Vf is less than 3V for a reverse bias current density of over 35A/cm$^2$.

Of course, the various reverse current conduction paths described above are intended to represent only the paths followed by the majority of the current flowing between the emitter region and the channel stop region. Some small fraction of the current will naturally flow via some other routes but the effect of this minority current will not have a large impact on the total resistance to the total flow of current from the emitter region to the channel stop region which is mostly determined by the path of least resistance which is represented by the conduction paths described above.

Formation of the high minority-carrier-lifetime region 4c can conveniently be achieved by any of a number of per se known localised lifetime killing techniques, such as direct wafer bonding and proton implantation, as well as other techniques generally known in the art, rather than a global lifetime killing technique, such as electron irradiation, as is conventionally used. Ideally the base region 4 will have a minority-carrier-lifetime profile which varies continuously from being relatively low near the junction between the collector region 2 and the base region 4 and relatively high near the emitter 6 and termination 16 portions which is where the high minority-carrier-lifetime region 4c is preferably located.

Although the present invention has been described with reference to a single embodiment as shown in the sole FIGURE, it will be apparent to a person skilled in the art that many variations to the described embodiment are possible without departing from the scope of the invention which is to be determined by reference to the accompanying claims. In particular, although the described embodiment shows an IGBT having a pnp bipolar transistor structure formed therein, an IGBT according to the present invention could be formed with an npn bipolar transistor structure. Similarly, although the present embodiment has been shown to have a solid N+ buffer layer, in certain circumstances it may be desirable to at least partially dispense with the N+ buffer layer, particularly in, for example, high voltage IGBT's.

It will be apparent, that although the present invention has been described in relation to an IGBT, it may also find application in similar devices such as, for example, thyristors in which it is desired to provide an inbuilt, reverse diode characteristic.

What is claimed is:

1. An insulated gate bipolar transistor having a collector electrode, an emitter region and a base region formed between the collector electrode and the emitter region, further including a channel stop region spaced from the emitter region and electrically connected to the collector electrode, wherein the base region includes a first region between the emitter region and the channel stop region and a second region between the first region and the collector electrode, the first region having a higher minority-carrier-lifetime than the second region, whereby the first region provides a conductivity modulated conduction path between the emitter region and the channel stop region when the insulated gate bipolar transistor is reverse biased.

2. A driving circuit for a lamp incorporating an insulated gate bipolar transistor as claimed in claim 1.

* * * * *